(12) United States Patent
Sun et al.

(10) Patent No.: US 12,276,914 B2
(45) Date of Patent: Apr. 15, 2025

(54) DEVELOPING METHOD AND APPARATUS

(71) Applicant: CHANGXIN MEMORY TECHNOLOGIES, INC., Hefei (CN)

(72) Inventors: Helei Sun, Hefei (CN); Buxiang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 643 days.

(21) Appl. No.: 17/575,865

(22) Filed: Jan. 14, 2022

(65) Prior Publication Data
US 2022/0146942 A1 May 12, 2022

Related U.S. Application Data

(63) Continuation of application No. PCT/CN2021/103867, filed on Jun. 30, 2021.

(30) Foreign Application Priority Data

Nov. 9, 2020 (CN) .......................... 202011241124.0

(51) Int. Cl.
*G03F 7/30* (2006.01)
*G03F 7/16* (2006.01)
*H01L 21/67* (2006.01)

(52) U.S. Cl.
CPC ............ *G03F 7/3021* (2013.01); *G03F 7/162* (2013.01); *H01L 21/67017* (2013.01)

(58) Field of Classification Search
CPC ... G03F 7/3021; G03F 7/162; H01L 21/67017
See application file for complete search history.

(56) References Cited

FOREIGN PATENT DOCUMENTS

| CN | 1289970 C | 12/2006 |
|---|---|---|
| CN | 1841213 B | 12/2011 |
| CN | 102445862 A | 5/2012 |
| CN | 202794853 U | 3/2013 |
| CN | 209962094 U | 1/2020 |
| CN | 210573195 U | 5/2020 |
| CN | 210605359 U | 5/2020 |
| JP | 2010182715 A | 8/2010 |
| TW | 200837837 A | 9/2008 |

OTHER PUBLICATIONS

TW200837837A English Translation, retrieved from Espace, published 2008.*

* cited by examiner

*Primary Examiner* — Minh Q Phan
(74) *Attorney, Agent, or Firm* — Kilpatrick Townsend & Stockton LLP

(57) ABSTRACT

A developing method and apparatus are provided. The developing method includes: obtaining airflow conditions above a wafer to be developed; setting a developing procedure according to the airflow conditions; and developing the wafer to be developed according to the developing procedure.

8 Claims, 3 Drawing Sheets

ND APPARATUS

CROSS-REFERENCE TO RELATED APPLICATIONS

This is a continuation application of International Patent Application No. PCT/CN2021/103867, filed on Jun. 30, 2021, which claims priority to Chinese Patent Application No. 202011241124.0, filed on Nov. 9, 2020 and entitled "DEVELOPING METHOD AND APPARATUS". The disclosures of International Patent Application No. PCT/CN2021/103867 and Chinese Patent Application No. 202011241124.0 are incorporated by reference herein in their entireties.

TECHNICAL FIELD

The embodiment of the present disclosure relate to semiconductor technologies, in particular to a developing method and apparatus.

BACKGROUND

The photolithography process is a common process in a manufacturing process of semiconductor devices. The photolithography process includes multiple processes, such as gluing, exposure, and developing. The developing procedure is to apply a developer onto an exposed photoresist to remove a part of the photoresist to form the photolithographic patterns.

During the developing procedure, airflow conditions in the developing component are very important. Abnormal airflow conditions may cause different temperatures at different positions of the wafer, resulting in different development reaction rates, so that the quality of the photolithographic patterns formed after development is finally worsen.

SUMMARY

An embodiment of the present disclosure provides a developing method and apparatus, so that the quality of the photolithographic patterns formed after development is improved.

In a first aspect, an embodiment of the present disclosure provides a developing method, which includes the following operations.

Airflow conditions above a wafer to be developed are obtained.

A developing procedure is set according to the airflow conditions.

The wafer to be developed is developed according to the developing procedure.

In a second aspect, an embodiment of the present disclosure provides a developing apparatus, which includes:

a wafer stage configured to place a wafer to be developed;
an airflow detection apparatus configured to detect airflow conditions above the wafer to be developed placed on the wafer stage; and
a controller configured to set a developing procedure according to the airflow conditions to develop the wafer to be developed.

BRIEF DESCRIPTION OF THE DRAWINGS

In order to describe the technical solutions in embodiments of the present disclosure more clearly, the accompanying drawings required to be used in the embodiments of the present disclosure will be simply introduced below. Apparently, the accompanying drawings in the following description show merely some embodiments of the present disclosure, and persons of ordinary skill in the art may still derive other drawings from these accompanying drawings without creative effort.

DETAILED DESCRIPTION

In order to make the objectives, technical solutions, and advantages of the present disclosure clearer, the technical solutions of the present disclosure will be clearly and completely described with reference to the accompanying drawings in the embodiments of the present disclosure. Apparently, the embodiments described here are merely some rather than all of the embodiments of the present disclosure. All other embodiments obtained by persons of ordinary skill in the art based on the embodiments of the present disclosure without creative efforts shall fall within the protection scope of protection of the present disclosure.

Before describing a developing method provided by the embodiment of the present disclosure, a developing apparatus will be introduced firstly. For different types of developing apparatuses, since their structures are different from each other, airflow conditions in the apparatuses may be different from each other. Exemplarily, FIG. 1 is a schematic diagram of a LITHIUS ProV-type developing apparatus.

Figure 1:
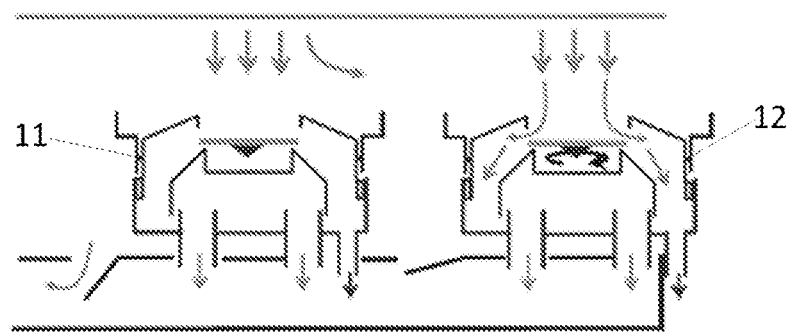
FIG. 1 is a schematic diagram of a LITHIUS ProV-type developing apparatus.

In FIG. 1, two developing components 11 and 12 are not arranged independently, and there is no barrier between the two developing components. Therefore, the airflows between the two developing components are in communication with each other, and the airflows between the two developing components may affect each other.

When the developing apparatus is configured to develop a wafer, after a developer is sprayed on the surface of the wafer to be developed, the development reaction rate is affected by temperature, and airflow conditions in different regions in the developing apparatus may affect the temperatures at different positions of the wafer.

In FIG. 1, since there is no barrier between the developing components 11 and 12, the airflow above the developing component 11 flows to the developing component 12, so that the airflow conditions at a position of the developing component 11 close to the developing component 12 are different from the air conditions at other positions. In this case, the temperature at a position of the wafer to be developed in the developing component 11 close to the developing component 12 is different from the temperature at other positions, which finally results in that the development reaction rate at the position close to the developing component 12 is different from the develop reaction rate at other positions, so that the developing line width at the position of the wafer to be developed in the developing component 11 close to the developing component 12 is inconsistent with the developing line width at other positions.

Hence, for some developing apparatuses of specific structures, the internal airflow conditions thereof are abnormal due to the structural limitations of the apparatuses, so that the quality of the photolithographic patterns after development is affected. In other examples, abnormal conditions of the developing component, such as exhaust failure, exhaust parameter drift or local disturbance, may cause abnormal airflow conditions in the developing component. For this purpose, in the developing method provided by the present disclosure, airflow conditions above the wafer to be developed are considered, and the developing procedure is set according to the airflow conditions. Through the settings of operations and/or process parameters of the developing procedure, airflows have the same influence on each position of the wafer to be developed. In this way, the temperature influence caused by different regional airflow conditions may be minimized, so that the quality of the photolithographic patterns formed after development is improved, and the sizes of the photolithographic patterns in different regions of the wafer are more uniform.

The developing method provided by the embodiment of the present disclosure is described in detail below with reference to specific embodiments. It should be understood that the following specific embodiments can be combined with each other, and the same or similar concepts or processes may not be repeated in some embodiments.

Figure 2:
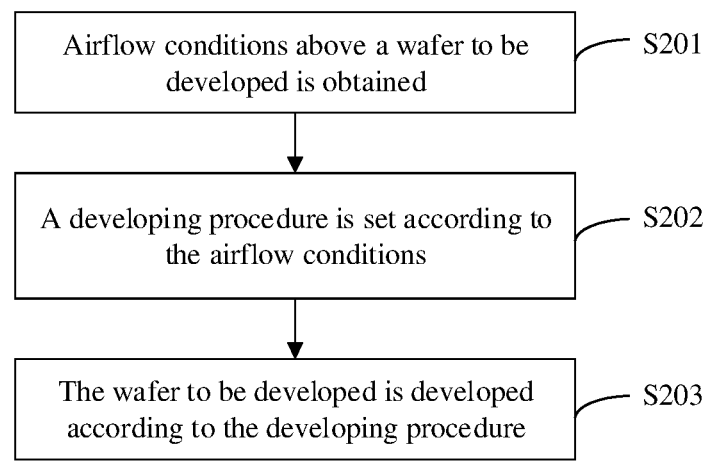
FIG. 2 is a flowchart of a developing method according to an embodiment of the present disclosure.

FIG. 2 is a flowchart of a developing method according to an embodiment of the present disclosure. As shown in FIG. 2, the developing method includes the following operations.

In S201, airflow conditions above a wafer to be developed are obtained.

For example, a space above the wafer to be developed can be divided into multiple regions according to the actual situation. The multiple regions may include a central position above the wafer to be developed and a region surrounding the central position. In other examples, the space above the wafer to be developed can also be divided into multiple concentric circular regions, and the projection of the center of concentric circles on the wafer to be developed coincides with the center of the wafer to be developed. Alternatively, the space above the wafer to be developed is divided into four quadrant areas of a rectangular coordinate system, and the projection of the origin of the rectangular coordinate system on the wafer to be developed coincides with the center of the wafer to be developed.

In some embodiments, the airflow conditions above the wafer to be developed may be detected by an airflow detection apparatus. The airflow detection apparatus may be arranged above the wafer to be developed. The airflow detection apparatus may include multiple detectors located at different positions. Each detector is configured to detect the airflow conditions in the region where it is located. The specific structure of the airflow detection apparatus is not limited in this embodiment.

The airflow conditions may include any detectable factors that may affect the temperature, such as an airflow velocity and/or an airflow pressure, which is not limited in this embodiment.

In some embodiments, the airflow conditions in at least one region above the wafer to be developed are different from the airflow conditions in other regions. For example, as shown in FIG. 1, the airflow conditions at a position of the developing component 11 close to the developing component 12 are different from the airflow conditions at other positions.

In S202, a developing procedure is set according to the airflow conditions.

The developing procedure in this embodiment may include various operations performed in the development process and corresponding parameters in each operation.

In some embodiments, the developing procedure may include a pre-wetting process, a main developing process, a rinsing process, and a spin-drying process. Corresponding parameters may be preset for each operation, for example, whether to rotate the wafer to be developed, the duration, and the concentration of the solution involved in each operation.

The pre-wetting process refers to spraying deionized water on the surface of the wafer to be developed. Since the developing procedure is performed after gluing and exposure, and the surface of the photoresist used for gluing and exposure is hydrophobic, while the developer is hydrophilic, when the developer is sprayed on the surface of the wafer to be developed, the developer may not completely cover the entire surface of the wafer to be developed, so that a part of the photoresist is not wet and developed. Therefore, the pre-wetting process is usually adopted after exposure, so as to improve the coverage of the wafer to be developed by the developer.

The main developing process after the pre-wetting process refers to spraying the developer on the surface of the wafer to be developed, so that the developer reacts with the photoresist to form a desired pattern. The rinsing process and the spin-drying process are performed after the main developing process to complete the developing procedure.

In the processes of the developing procedure, when performing the main developing process, the reaction rate of the developer and the photoresist is easily affected by temperature, which in turn affects the quality of the photolithographic patterns after development. Since the temperature at each position of the wafer to be developed is affected by the airflow conditions in different regions above the wafer to be developed, in this embodiment, the developing procedure is set according to the airflow conditions in different regions above the wafer to be developed, so as to improve the influence of temperature changes caused by different airflow conditions.

In S203, the wafer to be developed is developed according to the developing procedure.

After the developing procedure is set according to the airflow conditions, the developing apparatus is controlled to develop the wafer to be developed according to the developing procedure.

It should be noted that the operations in this embodiment can be repeatedly performed in the actual development process. For example, the airflow conditions above the wafer to be developed can be obtained at a preset time interval, and the developing procedure can be adjusted in real time according to the airflow conditions, so that the developing procedure is more suitable for the current airflow conditions, thereby further improving the quality of the photolithographic patterns formed after development.

With the developing method provided by this embodiment, the airflow conditions above the wafer to be developed are obtained, and the developing procedure is set according to the airflow conditions above the wafer to be developed, so that the influence of the airflow conditions in the different regions above the wafer to be developed on the quality of the photolithographic patterns formed after development can be reduced by adjusting the developing procedure, thereby improving the quality of the photolithographic patterns formed after development.

On the basis of the above embodiments, the parameters corresponding to the operation of the main developing process include a preset standing time, a preset rotation time, and a preset rotation speed. Accordingly, the main developing process includes the following operations.

The wafer to be developed is controlled to rotate at a preset rotation speed for a preset rotation time after the wafer to be developed is allowed to stand for a preset standing time; and the above operation is repeated until a preset development time is reached.

Among the multiple regions above the wafer to be developed, the airflow conditions in at least one region may be different from the airflow conditions in other regions. Referring to FIG. 1, for example, the airflow velocity in the region above the wafer to be developed in the developing component 11 close to the developing component 12 is greater than the airflow velocity in other regions, so that the temperature at a side of the wafer to be developed close to the developing component 12 may be relatively low, while the temperature at other positions may be relatively high. In this case, the development reaction rate at the side of the wafer to be developed close to the developing component 12 may be relatively slow, while the reaction rate at other positions may be relatively fast, which finally results in that the line width after development at the side of the wafer to be developed close to the developing component 12 is relatively narrow, while the line width at other positions are relatively wide. The line width here can be understood as the spacing between the photoresist retained after development.

In order to reduce the influence of the airflow, in this embodiment, the rotation of the wafer to be developed is controlled during the main developing process, so that the airflow uniformly affects each position of the wafer to be developed. Specifically, the wafer to be developed can be controlled to stand for a period of time, and then to rotate for a period of time. The standing process and the rotating process are repeated until the preset development time is reached. By rotating the wafer to be developed, the airflow above the wafer to be developed has the same influence on each position of the wafer to be developed.

It should be noted that the preset standing time in this embodiment may be 0. That is, the wafer to be developed is controlled to continuously rotate at the preset rotation speed without standing, so that the influence of the airflow on different positions of the wafer to be developed can be more uniform.

In combination with the above embodiments, the LITHIUS ProV-type developing machine as shown in FIG. 1 is taken as an example for description. In S203, the operation that the wafer to be developed is developed according to the developing procedure may include the following operation. The wafer to be developed is developed in the LITHIUS ProV-type developing machine according to the developing procedure.

For example, when the wafer to be developed is developed in the LITHIUS ProV-type developing machine, in the main developing process, after spraying the developer on the surface of the wafer to be developed, the wafer to be developed is controlled to rotate at the preset rotation speed for the preset rotation time after the wafer to be developed is allowed to stand for the preset standing time. The preset standing time ranges from 5 s to 15 s, the preset rotation speed ranges from 10 rpm to 30 rpm, and the preset rotation time ranges from 1 s to 5 s.

In some embodiments, the above operation is repeated three to six times, so that the time of the main developing process reaches the preset development time. The preset development time ranges from 40 s to 60 s.

For example, the wafer to be developed is controlled to rotate at a speed of 15 rpm for 1 second after the wafer to be developed is allowed to stand for 14 seconds, and the above operation is repeated four times until 60 seconds are reached.

For example, the wafer to be developed is controlled to rotate at a speed of 15 rpm for 2 seconds after the wafer to be developed is allowed to stand for 10 seconds, and the above operation is repeated four times until 48 seconds are reached.

It should be noted that the range of each of the preset standing time, the preset rotation speed and the preset rotation time in the above examples is exemplarily illustrated. In practical applications, each parameter can be adjusted according to actual needs, so as to ensure to the greatest extent that rotating positions of the wafer to be developed are all affected by the same airflow, so that the line widths of the photolithographic patterns formed after development at different positions are uniform.

In this embodiment, the developing procedure is set according to the airflow conditions. When the airflow conditions in different regions above the wafer to be developed are different from each other, the selection of the wafer to be developed is controlled, so that the rotating positions of the wafer to be developed are all affected by the same airflow, thereby improving the uniformity of the line widths.

It should be understood that after the airflow conditions above the wafer to be developed are obtained, the airflow conditions may be different or the same. Under the same airflow conditions, each of the preset rotation time and the preset rotation speed in the above embodiments can be set to 0. That is, the wafer to be developed is only controlled to stand, so that unnecessary rotation can be avoided to prevent the developer from being thrown out of the surface of the wafer to be developed, thereby reducing the dosage of the developer and saving the development time. Under the different airflow conditions, the developing procedure is adjusted according to the airflow conditions. Specifically, the range of the preset rotation speed is set to 10 rpm to 30 rpm, and the range of the preset rotation time is set to 1 s to 6 s. With the above preset rotation speed range and preset rotation time range, the developer can be prevented from being excessively thrown out of the surface of the wafer to be developed, so as to ensure that the line width obtained after development is the same as the line width obtained after developing the wafer to be developed through the developing procedure in which each of the preset rotation time and the preset rotation speed is 0. In this way, the switching of the developing procedure is easier under the same airflow conditions and under different airflow conditions, while ensuring the quality of the photolithographic patterns formed after development.

On the basis of any one of the above embodiments, in addition to setting the developing procedure according to the airflow conditions, one or more of the preset standing time, the preset rotation time and the preset rotation speed in the developing procedure can also be adjusted according to the type and/or concentration of the developer.

For example, if the concentration of the developer is relatively high, the development reaction rate may be relatively fast, so that the preset standing time may be shortened, and the preset rotation speed and the preset selection time may be increased, thereby avoiding excessively long standing time, which results in that the position which is greatly affected by the airflow cannot be adjusted in time.

Figure 3:
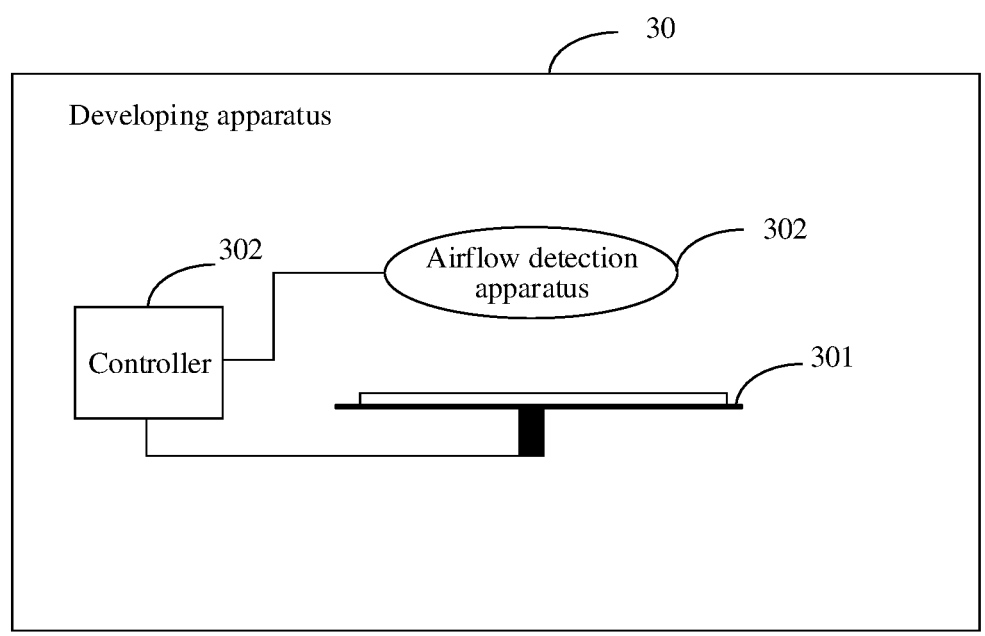
FIG. 3 is a schematic diagram of a developing apparatus according to an embodiment of the present disclosure.

FIG. 3 is a schematic diagram of a developing apparatus according to an embodiment of the present disclosure. As shown in FIG. 3, the developing apparatus 30 includes:

a wafer stage 301 configured to place a wafer to be developed;

an airflow detection apparatus 302 configured to detect airflow conditions above the wafer to be developed placed on the wafer stage 301; and a controller 303 configured to set a developing procedure according to the airflow conditions to develop the wafer to be developed.

In some embodiments, the controller 303 is configured to control the development of the wafer to be developed according to the developing procedure including a pre-wetting process, a main developing process, a rinsing process and a spin-drying process. Parameters of the main developing process include a preset standing time, a preset rotation time and a preset rotation speed.

The controller 303 is specifically configured to: control the wafer to be developed to rotate at the preset rotation speed for the preset rotation time after the wafer to be developed is allowed to stand for the preset standing time; and repeat the above operation until a preset development time is reached.

In some embodiments, the controller 303 is configured to set the preset standing time to 0.

In some embodiments, the controller 303 is configured to develop the wafer to be developed in a LITHIUS ProV-type developing machine according to the developing procedure.

For example, the controller 303 is configured to control the wafer to be developed to rotate at the preset rotation speed for the preset rotation time after the wafer to be developed is allowed to stand for the preset standing time. The preset standing time ranges from 6 s to 16 s, the preset rotation speed ranges from 10 rpm to 30 rpm, and the preset rotation time ranges from 1 s to 6 s. The controller is configured to repeat the above operation three to six times, so that the time of the main developing process reaches the preset development time, The preset development time ranges from 40 s to 60 s.

In some embodiments, the controller 303 is further configured to adjust one or more of the preset standing time, the preset rotation time and the preset rotation speed according to the type and/or concentration of the developer.

In some embodiments, the airflow conditions include an airflow velocity and/or an airflow pressure.

In some embodiments, the airflow conditions in at least one region of multiple regions are different from the airflow conditions in other regions.

The developing apparatus provided in this embodiment can be configured to perform the developing method in any one of the above embodiments, and the implementation principles and technical effects thereof are similar, which will not be repeated herein.

In the above embodiments, the specific structure of the airflow detection apparatus 302 can be set according to the layout of the developing apparatus 30. For example, the airflow detection apparatus 302 is of an annular structure, so as to facilitate detecting the airflow conditions above the wafer to be developed.

In some embodiments, if the airflow detection apparatus 302 is of an annular structure, the projection of the annular structure on the wafer to be developed is located in a region outside ⅔ of the radius of the wafer to be developed, so that the range of the airflow detection region is more suitable.

In some embodiments, the airflow detection apparatus 302 can detect the airflow conditions above the wafer to be developed placed on the wafer stage 301 in real time. The controller 303 can obtain, at a preset time interval, the airflow conditions detected by the airflow detection apparatus 302, and adjust the developing procedure according to the airflow conditions detected by the airflow detection apparatus 302.

In some embodiments, the controller 303 can control, at a preset time interval, the airflow detection apparatus 302 to detect the airflow conditions above the wafer to be developed placed on the wafer stage 301, and adjust the developing procedure according to the airflow conditions detected by the airflow detection apparatus 302.

In some embodiments, if the airflow conditions in different regions above the wafer to be developed detected by the airflow detection apparatus 302 are the same, each of the preset rotation time and the preset rotation speed can be set to 0 by the controller 303. That is, the wafer to be developed is only controlled to stand, so that unnecessary rotation can be avoided to prevent the developer from being thrown out of the surface of the wafer to be developed, thereby reducing the dosage of the developer and saving the development time. If the airflow conditions in different regions above the wafer to be developed detected by the airflow detection apparatus 302 are different from each other, the controller 303 can adjust the preset rotation time and the preset rotation speed in the developing procedure according to the airflow conditions. For example, the range of the preset rotation speed is set to 10 rpm to 30 rpm, and the range of the preset rotation time is set to 1 s to 6 s. With the above preset rotation speed range and preset rotation time range, the developer can be prevented from being excessively thrown out of the surface of the wafer to be developed, so as to ensure that the line width obtained after development is the same as the line width obtained after developing the wafer to be developed through the developing procedure in which each of the preset rotation time and the preset rotation speed is 0. In this way, the switching of the developing procedure is easier under the same airflow conditions and under the different airflow conditions, while ensuring the quality of the photolithographic patterns formed after development.

Those of ordinary skill in the art may understand that all or a part of the steps for implementing the above method embodiments may be completed through a program that instructs related hardware. The program may be stored in a computer-readable storage medium. When the program is executed, the steps comprising the above method embodiments are performed. The above storage medium comprises: various media such as a ROM, a RAM, a magnetic disk, an optical disk or the like that can store program code.

Finally, it should be noted that the above embodiments are merely used for describing rather than limiting the technical solutions of the present disclosure. Although the present disclosure is described in detail with reference to the foregoing embodiments, those of ordinary skill in the art should understand that the technical solutions specified in the above embodiments can still be modified, or some or all of the technical features therein can be equivalently substituted; and such modifications or substitutions do not make the essence of the corresponding technical solutions depart from the scope of the technical solutions of each of the embodiments of the present disclosure.

The invention claimed is:

1. A developing method, comprising:
    obtaining airflow conditions above a wafer to be developed;
    setting a developing procedure according to the airflow conditions; and
    developing the wafer to be developed according to the developing procedure, wherein the developing procedure comprises a pre-wetting process, a main developing process, a rinsing process, and a spin-drying process; and, wherein the main developing process comprises the following:

controlling the wafer to be developed to rotate at a preset rotation speed for a preset rotation time after the wafer to be developed is allowed to stand for a preset standing time; and repeating the operation of controlling the wafer to be developed to rotate at the preset rotation speed for the preset rotation time after the wafer to be developed is allowed to stand for the preset standing time until a preset development time is reached.

2. The developing method of claim 1, wherein
in a case that obtained airflow conditions in regions above the wafer to be developed are the same, each of the preset rotation speed and the preset rotation time is 0.

3. The developing method of claim 1, wherein
in a case that obtained airflow conditions in regions above the wafer to be developed are different from each other, the preset standing time ranges from 5 s to 15 s, the preset rotation speed ranges from 10 rpm to 30 rpm, and the preset rotation time ranges from 1 s to 5 s.

4. The developing method of claim 3, wherein repeating the operation of controlling the wafer to be developed to rotate at the preset rotation speed for the preset rotation time after the wafer to be developed is allowed to stand for the preset standing time until the preset development time is reached comprises:

repeating the operation of controlling the wafer to be developed to rotate at the preset rotation speed for the preset rotation time after the wafer to be developed is allowed to stand for the preset standing time three to six times until a time of the main developing process reaches the preset development time, wherein the preset development time ranges from 40 s to 60 s.

5. The developing method of claim 1, further comprising:
adjusting one or more of the preset standing time, the preset rotation time and the preset rotation speed according to at least one of a type of a developer or concentration of a developer.

6. The developing method of claim 1, wherein
the airflow conditions comprise at least one of an airflow velocity or an airflow pressure.

7. A developing apparatus, comprising:
a wafer stage configured to place a wafer to be developed;
an airflow detection apparatus configured to detect airflow conditions above the wafer to be developed placed on the wafer stage; and
a controller configured to set a developing procedure according to the airflow conditions to develop the wafer to be developed; and,
wherein the airflow detection apparatus is of an annular structure, and a projection of the annular structure on the wafer to be developed is located in a region outside $2/3$ of a radius of the wafer to be developed.

8. The developing apparatus of claim 7, wherein
the controller is configured to adjust the developing procedure at a preset time interval according to the airflow conditions detected by the airflow detection apparatus.

* * * * *